United States Patent
West et al.

(10) Patent No.: US 6,703,883 B2
(45) Date of Patent: Mar. 9, 2004

(54) LOW CURRENT CLOCK SENSOR

(75) Inventors: Jeffrey Alma West, Albuquerque, NM (US); Harold Garth Hanson, Albuquerque, NM (US); David W Oehler, Albuquerque, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 261 days.

(21) Appl. No.: 09/823,417

(22) Filed: Mar. 29, 2001

(65) Prior Publication Data

US 2002/0140485 A1 Oct. 3, 2002

(51) Int. Cl.[7] .............................. G06F 1/04; H03K 3/00
(52) U.S. Cl. ....................... 327/291; 327/112; 327/108; 327/391
(58) Field of Search ................................ 327/291, 299, 327/100, 102, 104, 108, 112, 334, 427, 374, 387, 379, 389, 391, 376, 377; 326/62, 83, 99, 82

(56) References Cited

U.S. PATENT DOCUMENTS

| 5,140,194 A | * | 8/1992 | Okitaka | 326/86 |
|---|---|---|---|---|
| 5,266,848 A | * | 11/1993 | Nakagome et al. | 326/62 |
| 5,534,810 A | * | 7/1996 | White | 327/308 |
| 5,585,740 A | * | 12/1996 | Tipon | 326/26 |
| 5,631,793 A | * | 5/1997 | Ker et al. | 361/56 |
| 5,672,983 A | * | 9/1997 | Yamamoto et al. | 326/27 |
| 5,729,165 A | * | 3/1998 | Lou et al. | 327/112 |
| 5,751,180 A | * | 5/1998 | D'Addeo | 327/379 |
| 5,874,844 A | * | 2/1999 | Shin | 327/206 |
| 5,923,192 A | * | 7/1999 | Hasegawa | 327/112 |
| 6,060,938 A | * | 5/2000 | Morrill | 327/391 |
| 6,154,069 A | * | 11/2000 | Ebihara | 327/112 |
| 6,230,255 B1 | * | 5/2001 | Asghar et al. | 712/32 |

\* cited by examiner

Primary Examiner—Terry D. Cunningham
Assistant Examiner—Long Nguyen
(74) Attorney, Agent, or Firm—Michael Schmitt

(57) ABSTRACT

The invention provides a clock sensor that can be operated at very low current and power. This sensor can also detect an input clock signal with a very small amplitude to detect the presence of clock inputs. According to one embodiment of the invention, a clock sensor comprises an input circuit configured to receive an input clock signal; a biasing circuit configured to receive the input clock signal and to provide biasing voltages; and a switching circuit configured to receive the biasing voltage and in response to the input clock signal, to provide a switching signal for switching an output circuit to generate an output clock signal. The input clock signal may have a small amplitude and the output clock signal has a full amplitude.

18 Claims, 4 Drawing Sheets

LOW CURRENT CLOCK SENSOR

BACKGROUND OF THE INVENTION

The invention generally relates to electronic circuits, and more particularly to clock sensors.

Clock sensors are used to detect clock signals in many applications. Conventional clock sensors are configured with standard CMOS inverters. However, these CMOS inverters cannot detect signals with small swings and they draw a significant amount of power. Differential amplifiers having differential pair inputs are also used as clock sensors to detect small signals, but they also consume too much power. In a typical application, a clock sensor is used with a PLL (phase locked loop) in portable devices (e.g., laptop and handheld computers) for detecting incoming clock signals to "wake up" the circuits in the device to let the circuits be ready for operations. In these devices, low power consumption by clock sensors is especially important. These conventional clock sensors, however, typically consume a large amount of current and power while waiting for incoming clock signals, resulting in very inefficient use of power in the portable devices.

Therefore, there is a need for a clock sensor that requires low current and low power to operate on.

SUMMARY OF THE INVENTION

The invention provides a clock sensor that can be operated at very low current and power. This sensor can also detect an input clock signal with a very small amplitude to detect the presence of clock inputs.

According to one embodiment of the invention, a clock sensor comprises an input circuit configured to receive an input clock signal; a biasing circuit, connected to the input circuit, that is configured to receive the input clock signal and to provide biasing voltages; and a switching circuit, connected to the biasing circuit, that is configured to receive the biasing voltage and in response to the input clock signal, to provide a switching signal for switching an output circuit to generate an output clock signal.

According to another embodiment of the invention, the clock sensor further comprises an output circuit, connected to the biasing circuit, that is configured to receive the switching signal and to generate the output clock signal in response to the switching signal. In this embodiment, the input clock signal has a small amplitude and the output clock signal has a full amplitude.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions.

DETAILED DESCRIPTION OF THE PREFERRED EMBODIMENTS

Figure 1:
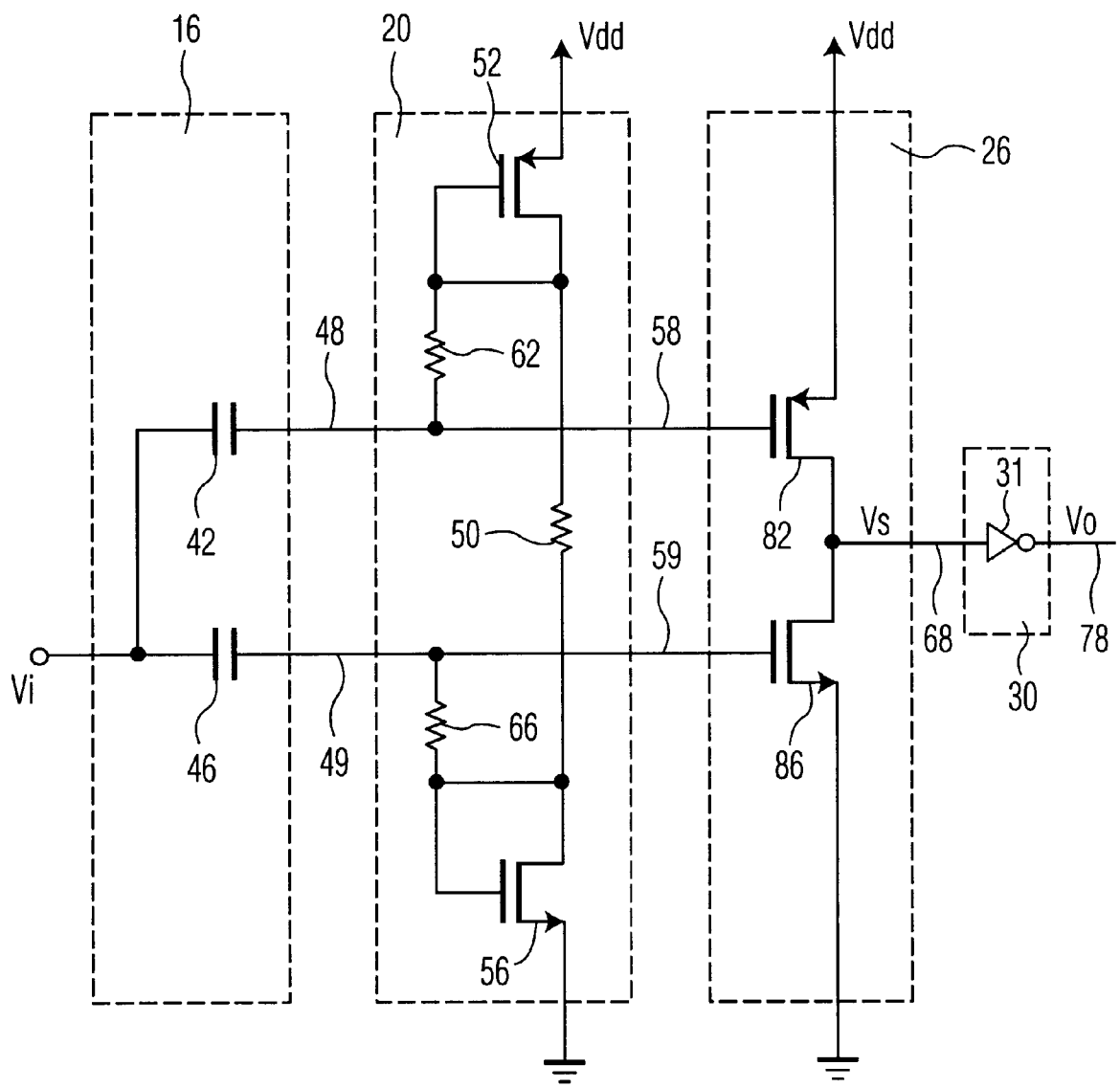
FIG. 1 shows a low current clock sensor according to one embodiment of the present invention.

FIG. 1 shows a low current clock sensor 10 according to one embodiment of the present invention. In FIG. 1, clock sensor 10 comprises an input circuit 16, a biasing circuit 20, a switching circuit 26 and an output circuit 30. The input circuit includes a pair of capacitors, 42 and 44, which are connected to biasing circuit 20 via signal lines 48 and 49, respectively. Biasing circuit 20 includes two transistors, 52 and 56, configured so that each functions as a diode. Transistors 52 and 56 are connected to each other via a biasing resistor 50. These transistors are also connected to biasing resistors 62 and 66, respectively, which are connected to signal lines 48 and 49, respectively. Biasing circuit 20 is connected to switching circuit 26 via signal lines 58 and 59. Switching circuit 26 includes transistors 82 and 86 and has its output connected to an output circuit 30 via signal line 68. Output circuit 30 includes an inverter 31 that provides an output clock signal $V_o$ to a clock detection circuit, such as a low pass filter (not shown), via signal line 78.

Figure 2A:
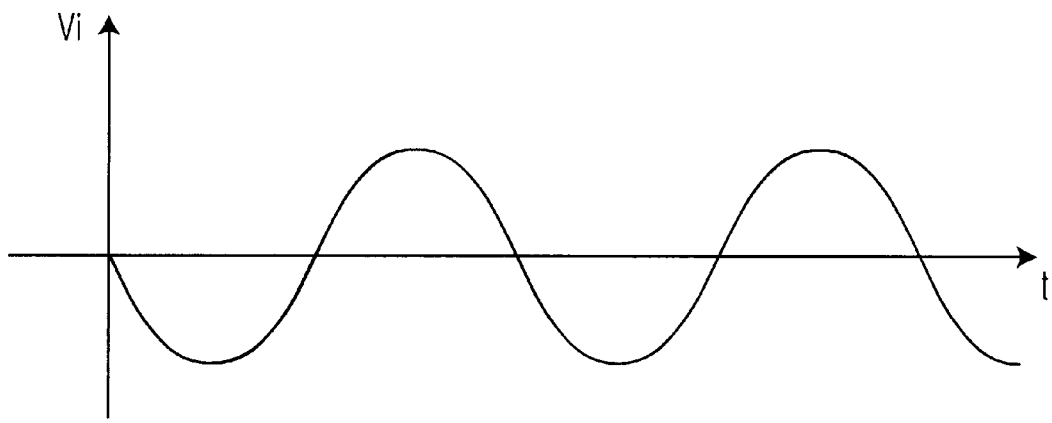
FIGS. 2A–2C illustrate various voltage signals in the embodiment in FIG. 1.
Figure 2B:
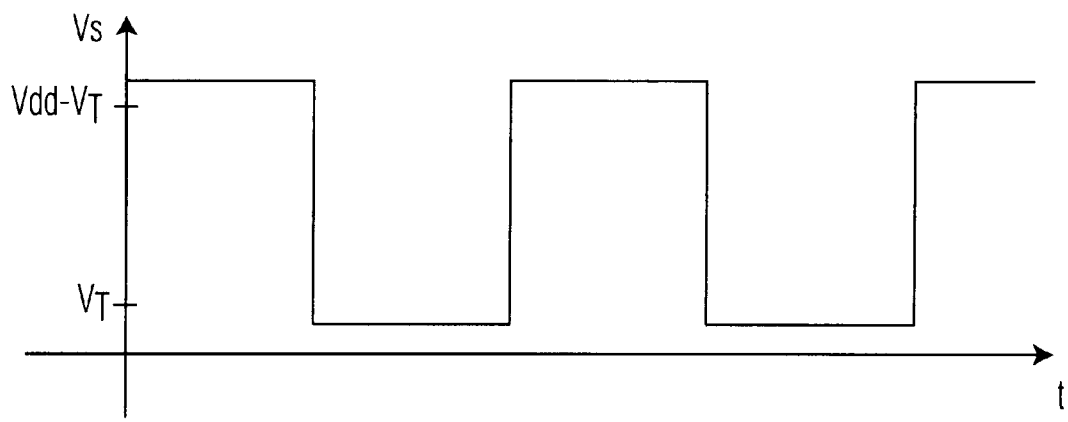
Figure 2C:
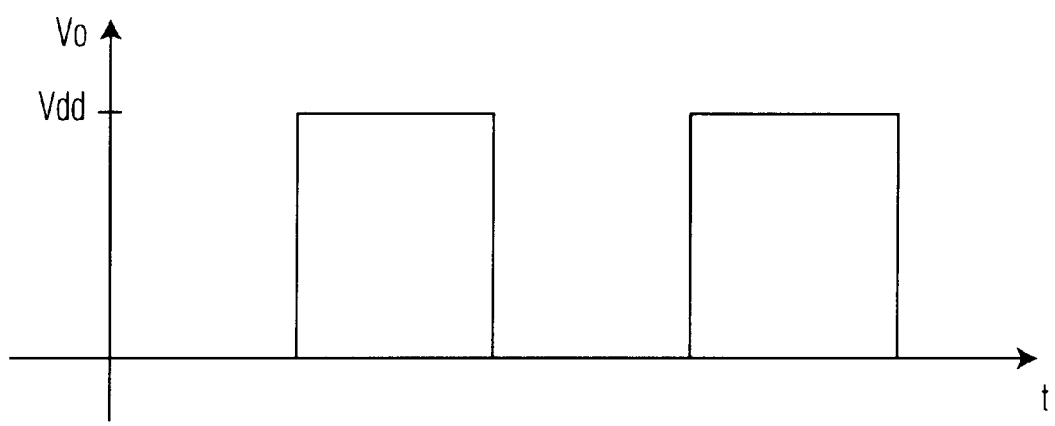

In operation, biasing circuit 20 provides biasing voltages to the gates of transistors 82 and 86. More specifically, when no input voltage is supplied, biasing circuit 20 supplies a first biasing voltage of $Vdd-V_T$ to the gate of transistor 82 via signal line 58 and a second biasing voltage of $V_T$ to the gate of transistor 86 via signal line 59. $V_T$ is the threshold voltage of a transistor and is typically about 0.7 V. By biasing the gate voltages of transistors 82 and 86 in switching circuit 26, these two transistors are kept in a near ON state. Thus, an input signal with a very small amplitude will activate transistors 82 and 86. Since the devices are kept very small, clock sensor 10 operates at very low power and consumes little current. When there is an input clock signal $v_i$, as illustrated in FIG. 2A, that is supplied to input circuit 16, transistors 62 and 66 are turned on/off, depending on the voltage value of the input clock signal. Switching circuit 26 outputs a switching voltage $v_s$ to inverter 31 via signal line 68. The value of $v_s$ fluctuates above and below the biasing voltages, as illustrated in FIG. 2B. Switching voltage $v_s$ switches inverter 31 on/off to cause the output clock signal $v_o$ to be high or low, as illustrated in FIG. 2C. The output clock signal $v_o$ is then sent to a clock detection circuit via signal line 78. The output clock signal $v_o$ is a stronger signal compared to the input signal $v_s$, and has the full amplitude of approximately Vdd. In this embodiment, even if the input clock signal $v_i$ has a small amplitude (e.g., down to a value of about 200 mV) it can still be detected by clock sensor 10.

In a specific embodiment of the invention, the ratio of the gate widths of transistors 52 and 56 is 2:2; the ratio of the gate widths of transistors 62 and 66 is 2:1; and the ratio of the gate widths of the transistors in inverter 31 is 4:2.

Figure 3:
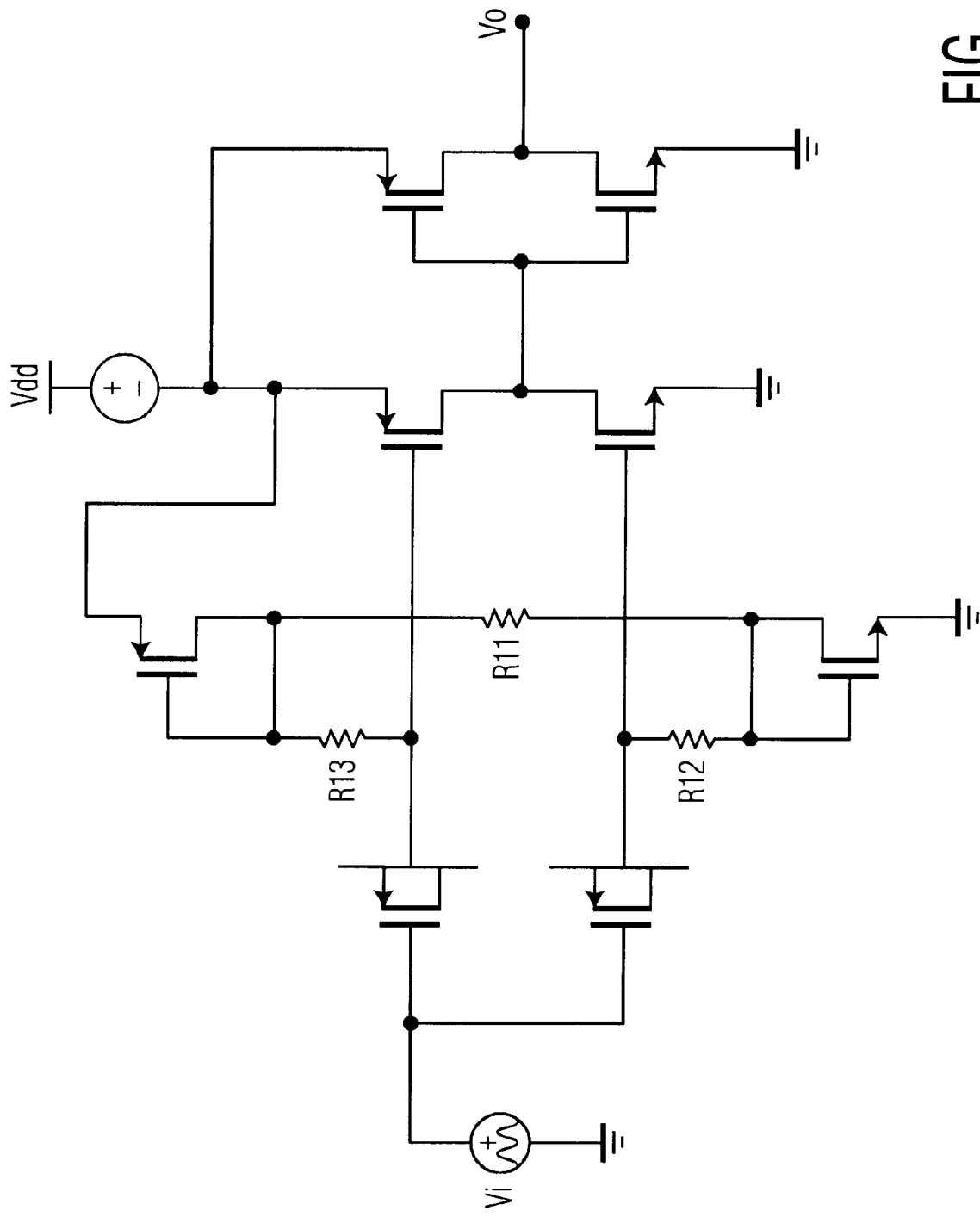
FIG. 3 shows a schematic implementation of the embodiment in FIG. 1.

FIG. 3 shows a schematic implementation of the embodiment in FIG. 1. As illustrated in FIG. 3, capacitors 42 and 46 are implemented with two MOS transistors with their source and drain electrodes connected together. This is convenient for the process used for the prototype, but is not the only way to realize a capacitor.

Figure 4:
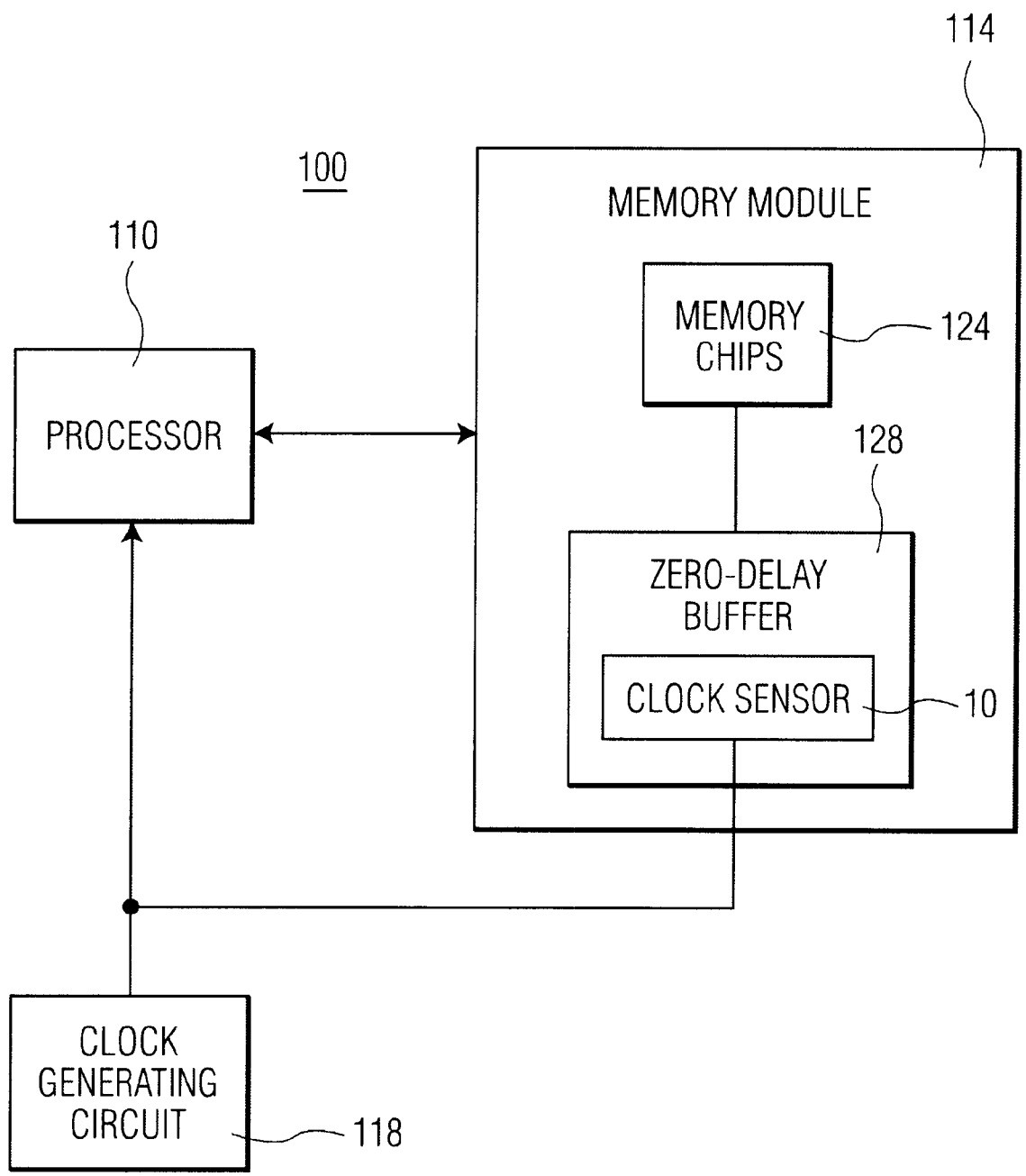
FIG. 4 illustrates an application of the invention in a computer system.

FIG. 4 illustrates an application of the present invention in a computer system 100, which includes a processor 110, a memory module 114 and a clock generating circuit 118. Memory module includes memory chips 124 and a clock buffer, e.g., a zero-delay buffer 128, which includes a clock sensor 10 of the invention. Clock generating circuit 118 supplies a clock signal to processor 110 and memory module 114 via buffer 128. Buffer 128 replicates the clock signal and distributes it to the memory cells in memory chips 124. In this application, the clock sensor in buffer 128 is used to detect whether a clock signal is coming so as to "wake up" memory chips 124 in the computer system in order to allow the system to return to active operation after a time in low power mode. Thus, while the system is in an inactive mode waiting for clock signals, the clock sensor requires little current to detect clock signals of small amplitudes and consumes very low power, which is especially important for portable systems.

While the invention has been described in conjunction with specific embodiments, it is evident that many alternatives, modifications and variations will be apparent to those skilled in the art in light of the foregoing description. For example, although CMOS transistors are used in the above embodiments of the invention, other types of transistors, such as bipolar transistors, or a combination of bipolar and MOS transistors can also be used. Accordingly, it is intended to embrace all such alternatives, modifications and variations as falling within the spirit and scope of the appended claims.

What is claimed is:

1. A clock sensor, comprising:
   an input circuit configured to received an input signal;
   a biasing circuit, connected to the input circuit, that is configured to receive the input signal and to provide biasing voltages; and
   a switching circuit, connected to the biasing circuit, that is configured to receive the biasing voltages that keep the switching circuit in a near ON state;
   wherein the biasing circuit comprises:
      a first diode coupled between a first power supply node and a first terminal of a first resistor so as to conduct current between the first power supply node and the first resistor;
      a second diode coupled between a second terminal of the first resistor and a second power supply node so as to conduct current between the first resistor and the second power supply node;
      a second resistor having a first terminal coupled to the first diode, and having a second terminal coupled to a first terminal of the switching circuit;
      a third resistor having a first terminal coupled to the second diode, and having a second terminal coupled to a second terminal of the switching circuit.

2. The sensor of claim 1, further comprising an output circuit, connected to the biasing circuit, that is configured to receive the switching signal and to generate the output clock signal in response to the switching signal.

3. The sensor of claim 2, wherein the output clock signal has a full amplitude.

4. The sensor of claim 1, wherein the switching circuit includes a pair of transistors having gates biased by the biasing voltages.

5. The sensor of claim 4, wherein the biasing circuit provides the biasing voltages to the switching circuit to keep the transistors of the switching circuit in a near ON state so as to allow the input clock signal with the substantially small amplitude to activate the transistors of the switching circuit.

6. The sensor of claim 4, wherein the input circuit includes a pair of capacitors each coupled to receive the input clock signal at its one end and to a gate of one of the transistors at its other end, the input clock signal switching ON/OFF the transistors.

7. The sensor of claim 2, wherein the switching circuit includes a pair of transistors having gates biased by the biasing voltages.

8. The sensor of claim 7, wherein the biasing circuit provides the biasing voltages to the switching circuit to keep the transistors of the switching circuit in a near ON state so as to allow the input clock signal with the substantially small amplitude to activate the transistors of the switching circuit.

9. The sensor of claim 8, wherein the input circuit includes a pair of capacitors each coupled between the input clock signal and a gate of one of the transistors, the input signal switching ON/OFF the transistors.

10. A clock sensor, comprising:
    input circuit configured to receive an input clock signal;
    a biasing circuit, connected to the input circuit, that is configured to receive the input clock signal and to provide biasing voltages; and
    a switching circuit, connected to the biasing circuit, that is configured to receive the biasing voltage and in response to the input clock signal, to provide a switching signal for switching an output circuit to generate an output clock signal;
    wherein the switching circuit includes a pair of transistors having gates biased by the biasing voltages;
    wherein the biasing circuit includes a pair of diodes, a first resistor, a second resistor and a third resistor, with the two diodes being connected to each other via the first resistor, the second resistor being connected between a first end of the first resistor and a gate of one of the transistors, the third resistor being connected to a second end of the first resistor and a gate of the other transistor.

11. The clock sensor of claim 10, wherein the pair of diodes comprises:
    a first p-channel field effect transistor (FET), the first p-channel FET having a source coupled to a first power supply node, and further having a gate and a drain coupled to each other; and
    a first n-channel FET, the first n-channel FET having a source coupled to a second power supply node, and further having a gate and a drain coupled to each other.

12. The clock sensor of claim 11, wherein the first power supply node is a positive voltage power supply node, and the second power supply node is a ground node.

13. The clock sensor of claim 11, wherein the pair of transistors of the switching circuit comprise:
    a second p-channel FET coupled source-to-drain between the first power supply node and a first intermediate node; and
    a second n-channel FET coupled drain-to-source between the first intermediate node and the second power supply node.

14. The clock sensor of claim 13, wherein the input circuit comprises:
    a first capacitor having a first terminal and a second terminal;
    a second capacitor having a first terminal and a second terminal; and
    wherein the first terminal of the first capacitor and the first terminal of the second capacitor are coupled together; the second terminal of the first capacitor is coupled to the gate of the second p-channel FET; and the second terminal of the second capacitor is coupled to the gate of the second n-channel FET.

15. The clock sensor of claim 14, wherein the first capacitor comprises a first FET having a drain coupled to a source; and the second capacitor comprises a second FET having a drain coupled to a source.

16. A computer system, comprising:

a processor;

a memory, connected to the processor, that includes a plurality of memory elements;

a clock generating circuit that supplies a clock signal to the processor and to the memory; and a clock buffer, connected between the clock generating circuit and the memory, that is configured to replicate the clock signal from the clock generation circuit and distribute it to the memory elements, the buffer including a clock sensor that comprises:

an input circuit configured to received an input signal, a biasing circuit, connected to the input circuit, that is configured to receive the input signal and to provide biasing voltages, and a switching circuit, connected to the biasing circuit, that is configured to receive the biasing voltages that keep the switching circuit in a near ON state, and an output circuit, connected to the switching circuit, that is configured to receive the switching signal and to generate an output signal in response to the switching signal;

wherein the biasing circuit comprises:

a first diode coupled between a first power supply node and a first terminal of a first resistor so as to conduct current between the first power supply node and the first resistor;

a second diode coupled between a second terminal of the first resistor and a second power supply node so as to conduct current between the first resistor and the second power supply node;

a second resistor having a first terminal coupled to the first diode, and having a second terminal coupled to a first terminal of the switching circuit;

a third resistor having a first terminal coupled to the second diode, and having a second terminal coupled to a second terminal of the switching circuit.

17. The sytem of claim 16, wherein the switching circuit of the clock sensor includes a pair of transistors having gates biased by the biasing voltages.

18. The system of claim 16, wherein the input circuit of the sensor includes a pair of capacitors each coupled between the input signal and a gate of one of the transistors, the input signal switching ON/OFF the transistors.

* * * * *